(12) United States Patent
Kita (10) Patent No.: US 7,193,841 B2
(45) Date of Patent: Mar. 20, 2007

(54) CIRCUIT ASSEMBLY AND HEAT-INSULATING MEMBER FOR CIRCUIT ASSEMBLY

(75) Inventor: Yukinori Kita, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 196 days.

(21) Appl. No.: 10/969,051

(22) Filed: Oct. 21, 2004

(65) Prior Publication Data

US 2005/0111166 A1   May 26, 2005

(30) Foreign Application Priority Data

Nov. 26, 2003   (JP)   ............... 2003-396086

(51) Int. Cl.
  *H02B 1/26*  (2006.01)
  *H01R 12/00*  (2006.01)
(52) U.S. Cl. ............... 361/641; 361/648; 439/76.2
(58) Field of Classification Search ............ None
  See application file for complete search history.

(56) References Cited

U.S. PATENT DOCUMENTS

| | | | | |
|---|---|---|---|---|
| 5,478,244 | A * | 12/1995 | Maue et al. | 439/76.2 |
| 5,822,189 | A * | 10/1998 | Isshiki | 361/736 |
| 6,213,788 | B1 * | 4/2001 | Murakami | 439/76.2 |
| 6,217,377 | B1 * | 4/2001 | Nishizawa | 439/553 |
| 6,315,578 | B1 * | 11/2001 | Kasai et al. | 439/76.2 |
| 6,602,079 | B2 * | 8/2003 | Chiriku et al. | 439/76.2 |
| 6,605,780 | B2 | 8/2003 | Chiriku et al. | |
| 6,634,892 | B2 * | 10/2003 | Nakamura | 439/76.2 |
| 6,835,073 | B2 * | 12/2004 | Kobayashi | 439/76.2 |
| 6,922,332 | B2 * | 7/2005 | Naimi et al. | 361/641 |

FOREIGN PATENT DOCUMENTS

JP     A 2002-330526     11/2002

* cited by examiner

*Primary Examiner*—Boris Chèrvinsky
(74) *Attorney, Agent, or Firm*—Oliff & Berridge, PLC (57) ABSTRACT

A heat-insulating member for a circuit assembly is interposed between a bus bar substrate to construct a circuit assembly in a compact structure and to provide a heat-insulating member that can be easily installed in the circuit assembly and constructed effectively in a thermal design. A control circuit substrate for performing a heat-insulating function between both the substrates. The bus bar substrate includes a plurality of bus bars constituting an electrical power circuit, circuit components to be connected to the electrical power circuit, and a plurality of upright terminals extending from the given bus bars. The control circuit substrate includes a control circuit for controlling the circuit components and is provided with through-holes into which the upright terminals are inserted and connected electrically. The control circuit substrate is disposed substantially in parallel to the bus bar substrate. The heat-insulating member includes a body section disposed between both the substrates and positioning and reinforcing sections for positioning the upright terminals at the positions corresponding to the through-holes and preventing the upright terminals from being deformed between both the substrates, respectively.

5 Claims, 10 Drawing Sheets

CIRCUIT ASSEMBLY AND HEAT-INSULATING MEMBER FOR CIRCUIT ASSEMBLY

CROSS-REFERENCE TO RELATED APPLICATION

The invention claims priority to Japanese Patent Application No. JP 2003-396086 filed on Nov. 26, 2003. The disclosure of the prior application is incorporated herein by reference in its entirety.

BACKGROUND OF THE INVENTION

1. Field of Invention

This invention relates to a heat-insulating member interposed between a bus bar substrate including an electrical power circuit and a control circuit substrate including a control circuit for controlling the circuit components connected to the electrical power circuit, and also relates to a circuit assembly utilizing the heat-insulating member to be installed in, for example, a distribution unit for distributing an electrical power from a common electrical power source on a vehicle among a plurality of electronic units.

2. Description of Related Art

Recently, a number of electronic units are installed on a vehicle such as a motor vehicle and a distribution unit is generally used for distributing an electrical power from a common electrical source on a vehicle among the respective electronic units. A circuit assembly to be installed in the distribution unit has been known. Such circuit assembly, as disclosed in, for example, Japanese Patent Public Disclosure 2002-330526, includes a stacked circuit section (bus bar substrate) in which bus bars constituting an internal circuit are stacked through insulation plates at plural layers. The bus bar on a lower layer of the stacked circuit section is bent to form a tab terminal. The tab terminal is inserted into a receiving-aperture in the stacked circuit section and projects from a front side of the aperture. A tab terminal of a relay is connected to the tab terminal of the bus bar through a junction terminal having a female type-coupling portion on the opposite ends, so that the relay is detachably connected to the internal circuit.

An occupation area for arranging the distribution unit on a vehicle body tends to be decreased every year. On the other hand, a number of circuit components have been mounted on the bus bar substrate and control circuit substrate. In association with this tendency, it has been eagerly required to efficiently arrange the circuit components and to downsize the contribution unit and the circuit assembly to be installed in the contribution unit.

However, in the distribution unit and circuit assembly disclosed in the above Patent Document 1, if the circuit components to be mounted on the respective substrates increase in number, the circuit components are disposed on the respective substrates individually and useless spaces will increase. This will make it difficult to efficiently arrange the circuit components and to maintain a compact structure of the circuit assembly.

Thus, if the control circuit substrate is disposed in parallel to the bus bar substrate and the circuit components to be mounted on the respective substrates are efficiently arranged in the space defined between both the substrates, it will be possible to maintain compact structures of the distribution unit and circuit assembly.

However, in such a double-deck structure in which the bus bar substrate and control circuit substrate are disposed in parallel to each other and the circuit components are arranged between both the substrates, heat generated from the circuit component such as a relay that is mounted on the bus bar substrate and has a relatively high heating value affects the control circuit substrate. In addition, this double-deck structure makes electrical connection between both the substrates when pin-like terminals standing from the bus bar substrate are forcedly inserted into through-holes in the control circuit substrate. This will make it difficult to insert the pin-like terminals projecting upward from the upper surface of the bus bar substrate into the through-holes in the control circuit substrate correctly and positively. Consequently, the pin-like terminal will tend to be buckled, bent, or deformed upon insertion. This will lose reliability in electrical connection.

In view of the above problems, an object of the exemplary invention is to provide a circuit assembly in a compact structure and a heat-insulating member that can be easily installed in the circuit assembly and constructed effectively in a thermal design.

SUMMARY OF THE INVENTION

In order to achieve the above object, various exemplary embodiments of the invention are directed to a heat-insulating member for a circuit assembly interposed between a bus bar substrate and a control circuit substrate for performing a heat-insulating function between both the substrates. The bus bar substrate includes a plurality of bus bars constituting an electrical power circuit, circuit components to be connected to the electrical power circuit, and a plurality of upright terminals extending from the given bus bars. The control circuit substrate includes a control circuit for controlling the circuit components and is provided with through-holes into which the upright terminals are inserted and connected electrically.

The control circuit substrate is disposed substantially in parallel to the bus bar substrate. The heat-insulating member includes a body section disposed between the bus bar substrate and the control circuit substrate, and positioning and reinforcing sections for positioning the upright terminals at the positions corresponding to the through-holes and preventing the upright terminals from being deformed between both the substrates, respectively.

According to exemplary embodiments of the invention, because the body section is interposed between the bus bar substrate and the control circuit substrate, the heat generated from the circuit components mounted on the bus bar substrate can be restrained from affecting the control circuit substrate and to dispose the bus bar substrate and control circuit substrate in a close arrangement. The circuit components can be efficiently arranged by effectively utilizing the space defined between both the substrates. Accordingly, exemplary embodiments of the invention can produce the circuit assembly in a compact structure.

Because the body section is interposed between the bus bar substrate and the control circuit substrate in conjunction with the positioning and reinforcing sections coincide the upright terminals with the respective through-holes and prevent the upright terminals from being deformed, the upright terminals can be positioned by the positioning and reinforcing sections and oppose the upright terminals to the through-holes. The positioning and reinforcing sections can reinforce the upright terminals and prevent the upright terminals from being deformed or bent by buckling upon assembling both the substrates, thereby obtaining positive connection between them.

It is preferable in exemplary embodiments of the invention that a receiving aperture is provided in each of the positioning and reinforcing sections and each of the receiving apertures surrounds each of the upright terminals inserted into the receiving apertures over the given length of the upright terminals.

According to the above structure, the upright terminals can be easily positioned merely by inserting the upright terminals into the receiving apertures in the positioning and reinforcing sections and also to restrain deformation of the upright terminals.

In this case, each of the receiving apertures provided in the positioning and reinforcing sections is not limited to a concrete shape. However, it is preferable that the through-hole is tapered from the side of the bus bar substrate to the side of the control circuit substrate.

According to the above structure, because the opening of the receiving aperture at the side of the bus bar substrate is greater than the opening of the receiving aperture at the side of the control circuit substrate, even if the upright terminal is shifted slightly from the receiving aperture, the receiving aperture can correct such shifting. Because the receiving aperture is tapered toward the control circuit substrate, the upright terminal can be positively positioned.

Furthermore, although in exemplary embodiments of the invention the positioning and reinforcing sections surround the upright terminals over the given length of the terminals to position the terminals and prevent deformation of the terminals, the length of surrounding the upright terminals by the positioning and reinforcing sections is not limited and may be determined suitably. For example, the positioning and reinforcing sections may extend to the lower half portion of the upright terminals.

According to the above structure, it is possible to surely prevent deformation, particularly buckling deformation of the upright terminals and to obtain positive electrical connection between the control circuit substrate and the upright terminals.

On the other hand, various exemplary embodiments of the invention are also directed to a circuit assembly comprising a bus bar substrate and a control circuit substrate. The bus bar substrate includes a plurality of bus bars constituting an electrical power circuit, circuit components to be connected to the electrical power circuit, and a plurality of upright terminals extending from the given bus bars. The control circuit substrate includes a control circuit for controlling the circuit components and is provided with through-holes into which the upright terminals are inserted and connected electrically. The control circuit substrate is disposed substantially in parallel to the bus bar substrate. A heat-insulating member for a circuit assembly is interposed between the bus bar substrate and the control circuit substrate.

According to the exemplary invention, because a circuit assembly comprises the bus bar substrate that includes a plurality of bus bars constituting an electrical power circuit, circuit components to be connected to the electrical power circuit, and a plurality of upright terminals extending from the given bus bars, and the control circuit substrate that includes a control circuit for controlling the circuit components and is provided with through-holes into which the upright terminals are inserted and connected electrically, the circuit components can be efficiently arranged between the bus bar substrate and the control circuit substrate and to obtain a compact structure.

In the case where the circuit components are disposed between both the substrates, concerns may be raised that the heat generated from the circuit components in association with their actuation affects the control circuit substrate. However, the heat-insulating member for the circuit assembly can restrain such heat from transferring to the control circuit substrate and presents an excellent heat design. Because the heat-insulating member for the circuit assembly is used as a heat-insulating member for a circuit assembly, it is possible to insert the upright terminals provided on the bus bar substrate into the through-holes in the control circuit substrate suitably and surely, thereby making positive electrical connection between both the substrates.

According to the heat-insulating member for the circuit assembly, the control circuit substrate and bus bar substrate can be disposed in the close arrangement, to efficiently arrange the circuit components between the bus bar substrate and the control circuit substrate, and to produce a compact circuit assembly.

Upon production of the circuit assembly, the positioning and reinforcing sections can position the upright terminals so that the upright terminals are opposed to the through-holes and reinforce the upright terminals. The positioning and reinforcing sections can positively prevent the upright terminals from being deformed or bent by buckling, thereby making electrical connection between both the substrates.

On the other hand, the circuit assembly can restrain affection due to the heat generated from the circuit components on the bus bar substrate, can dispose the control circuit substrate near the bus bar substrate, and can obtain a compact structure. In addition, because the heat-insulating member is used in the circuit assembly, the bus bar substrate and control circuit substrate can be electrically connected to each other securely.

BRIEF DESCRIPTION OF THE DRAWINGS

The accompanying drawings, which are incorporated into and constitute a part of the specification, illustrate one or more embodiments of the invention and, taken with the detailed description, serve to explain the principles and implementations of the invention. In the drawings.

DETAILED DESCRIPTION OF EXEMPLARY EMBODIMENTS

Referring now to the drawings, a preferred embodiment of a circuit assembly in accordance with the exemplary invention will be describe below. A circuit assembly and a distribution unit are described which distribute an electrical power supplied from a common power source mounted on a vehicle to a plurality of electrical loads (for example, a head light unit, a small light unit, a horn unit, a washer unit, a security horn unit, and the like).

Figure 1:
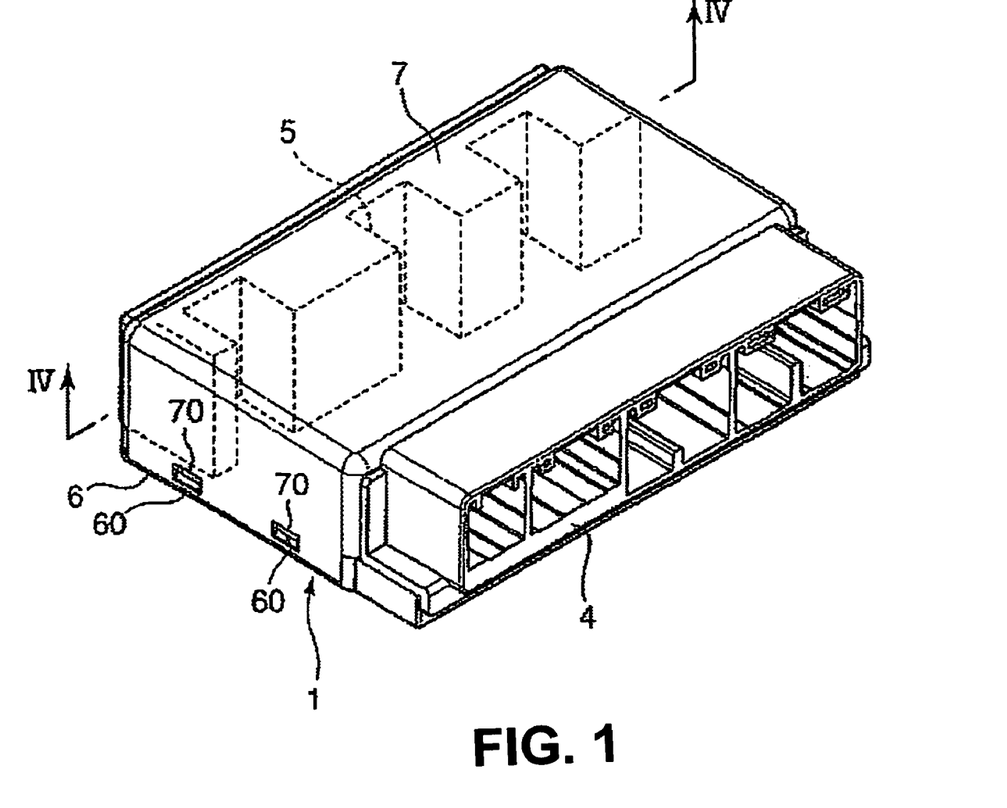
FIG. 1 is a perspective view of a distribution unit in which a circuit assembly in accordance with the exemplary invention is installed, illustrating the distribution unit in an inverted position.

However, the circuit assembly of the exemplary invention is not limited to the above applications. The circuit assembly can be broadly used to an on-off switching application in which conduction in an electrical power circuit is carried by a circuit component such as a relay. Such a circuit assembly is installed in a distribution unit 1 shown in FIG. 1. FIG. 1 is a perspective view of the distribution unit 1, illustrating the unit in an inverted position.

The distribution unit 1 has a substantially rectangular parallelepiped configuration and is very compact although it has a function of distributing an electrical power to a plurality of electrical loads (five electrical units in this embodiment). In the exemplary embodiment, the distribution unit 1 can be contained in a space having a longitudinal side of 75 mm, a lateral side of 100 mm, and a height of 25 mm.

Figure 2:
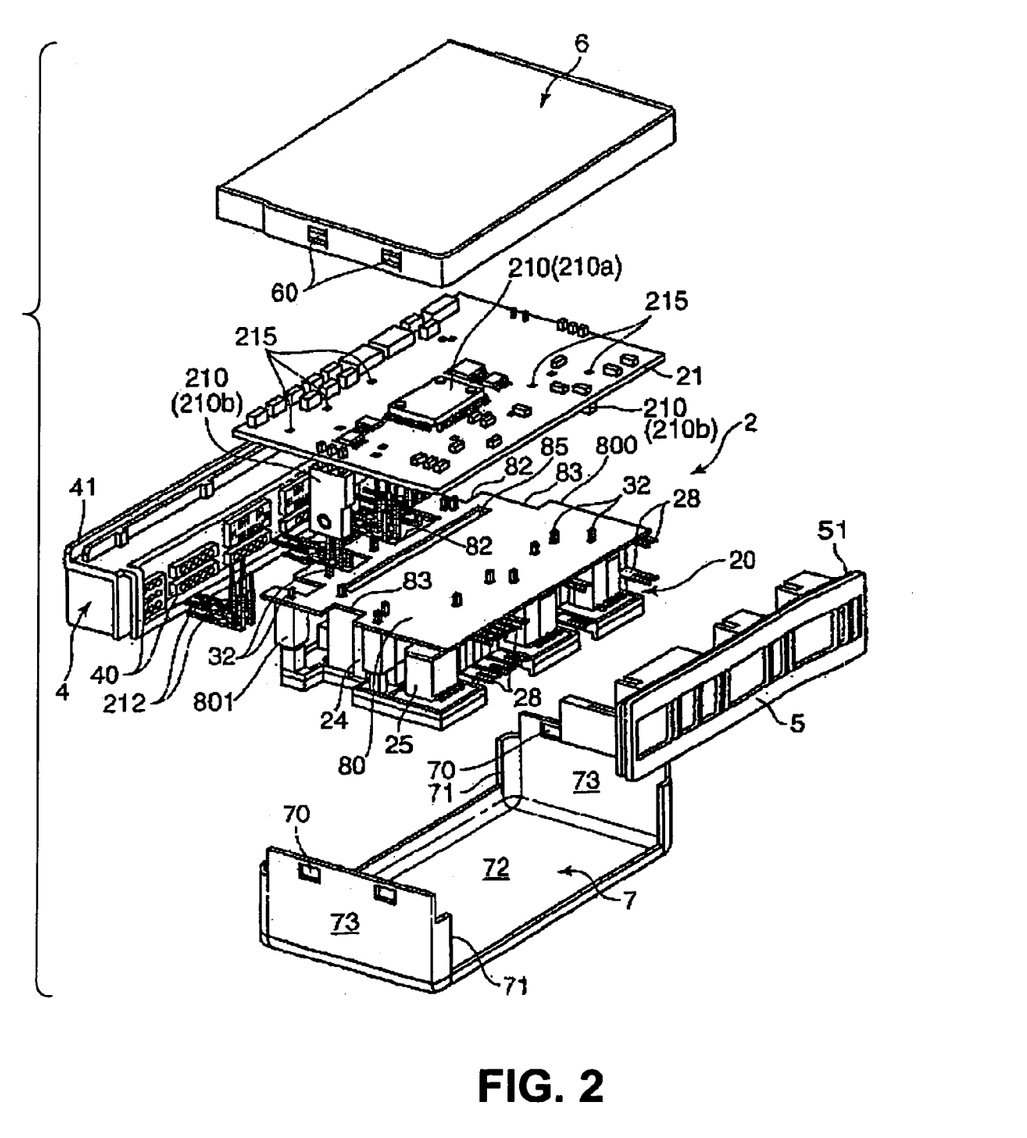
FIG. 2 is an exploded perspective view of the distribution unit shown in FIG. 1.

The distribution unit 1, as shown in FIG. 2, comprises a circuit assembly 2 including a control circuit substrate 21 and a bus bar substrate 20, a connector mounting-section 4 and a fuse mounting-section 5 that are secured to the circuit assembly 2, and an upper casing 6 and a lower casing 7 that contain the circuit assembly 2 supporting the mounting-sections 4 and 5 with the casings 6 and 7 clamping the circuit assembly 2 in a vertical direction so that the mounting-sections 4 and 5 are exposed. For the convenience of explanation, the words "front side" and "vertical direction" in the specification define a side on which the connector mounting-section 4 is formed in the distribution unit 1 and a height direction in FIG. 2, respectively.

Figure 3:
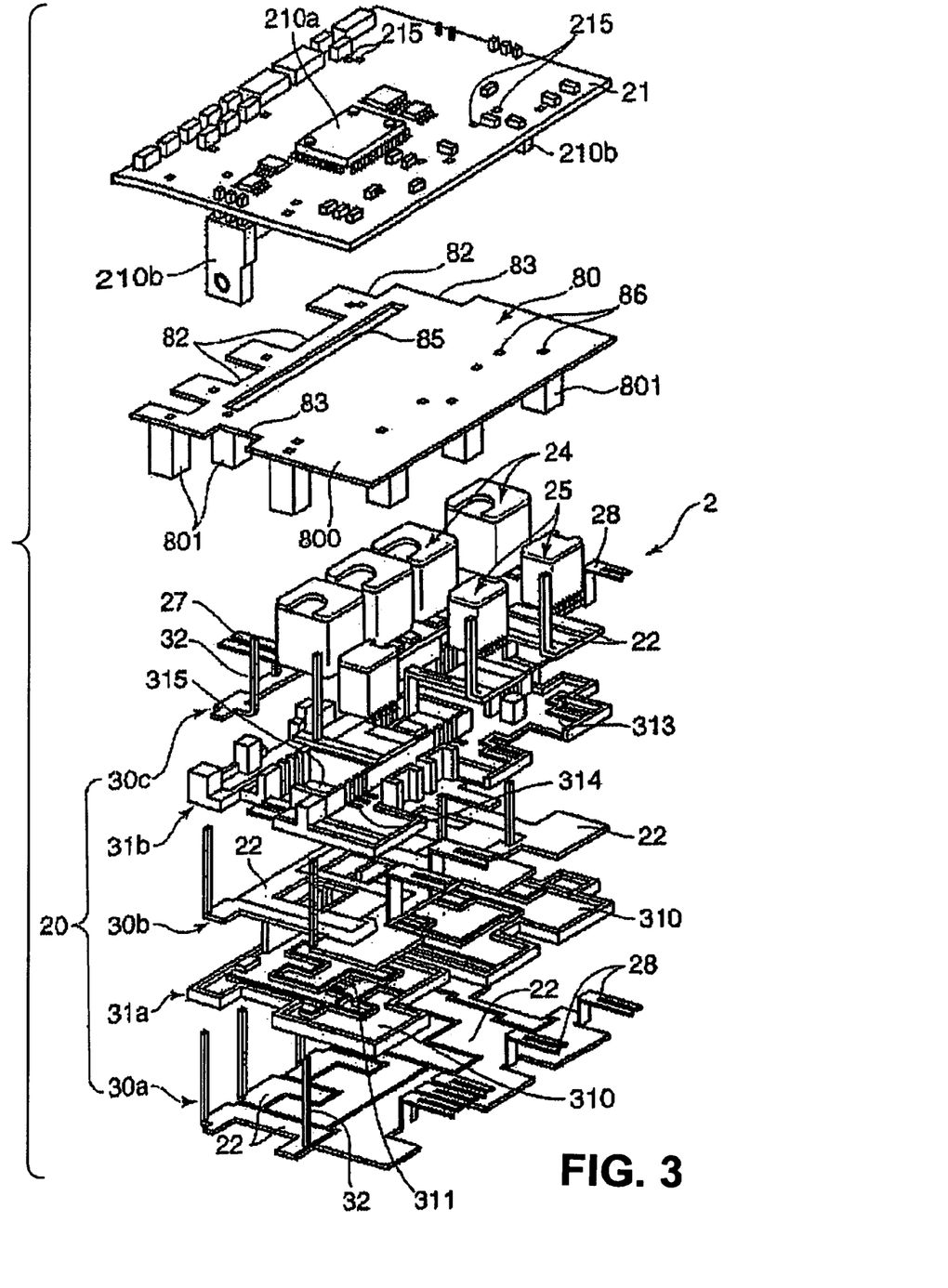
FIG. 3 is an exploded perspective view of the circuit assembly in accordance with the exemplary invention.
Figure 4:
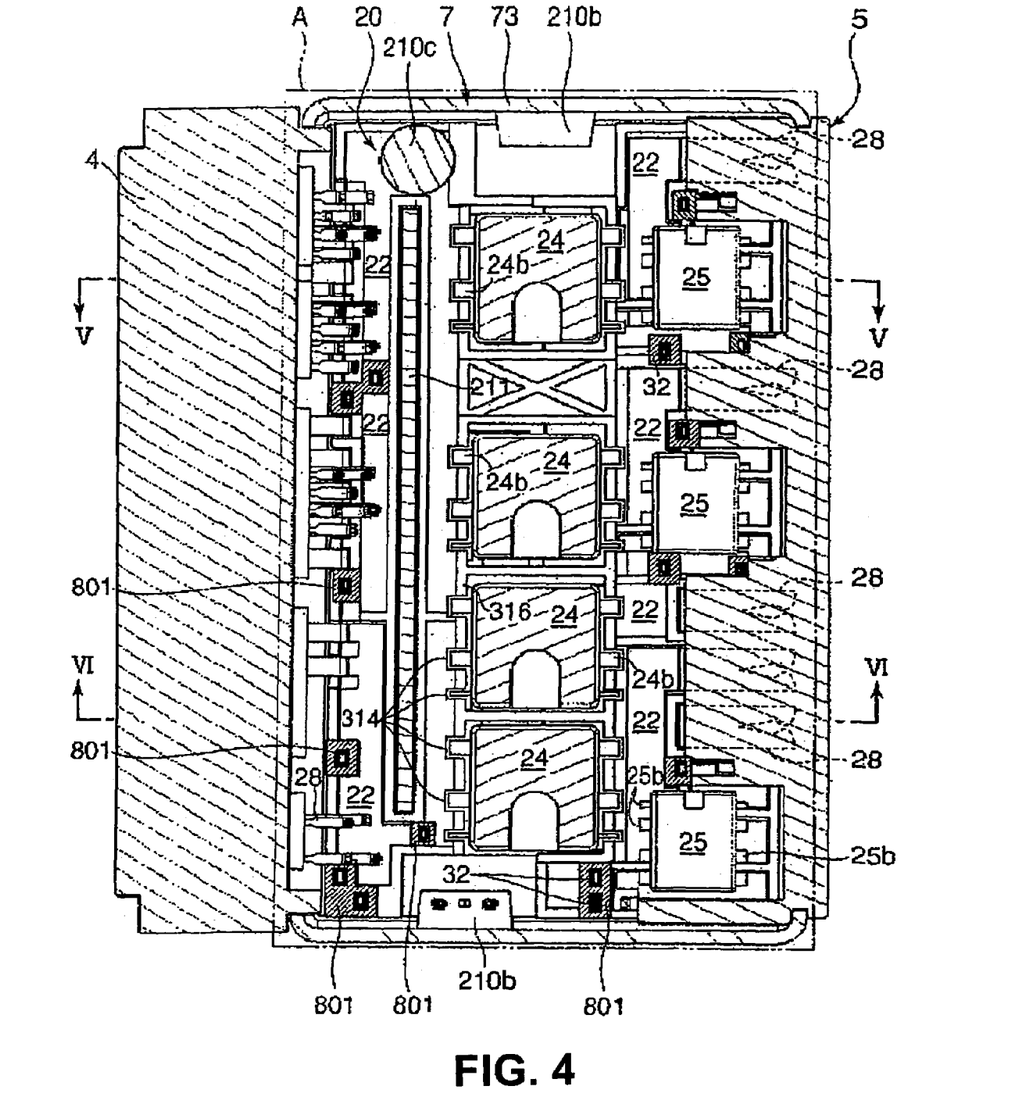
FIG. 4 is a longitudinal sectional view of the distribution unit taken along line IV—IV in FIG. 1.
Figure 5:
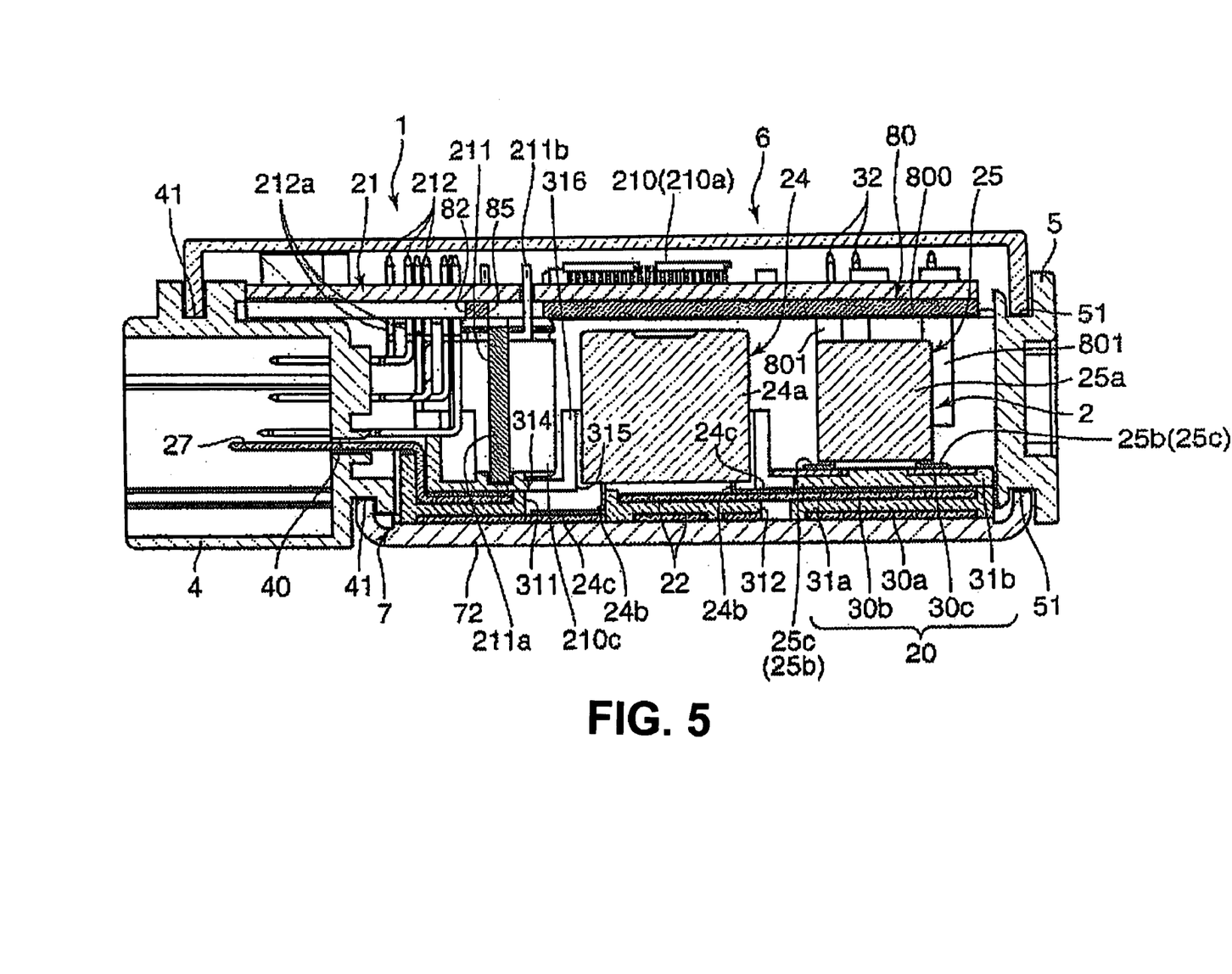
FIG. 5 is a cross sectional view of the distribution unit taken along line V—V in FIG. 4.
Figure 6:
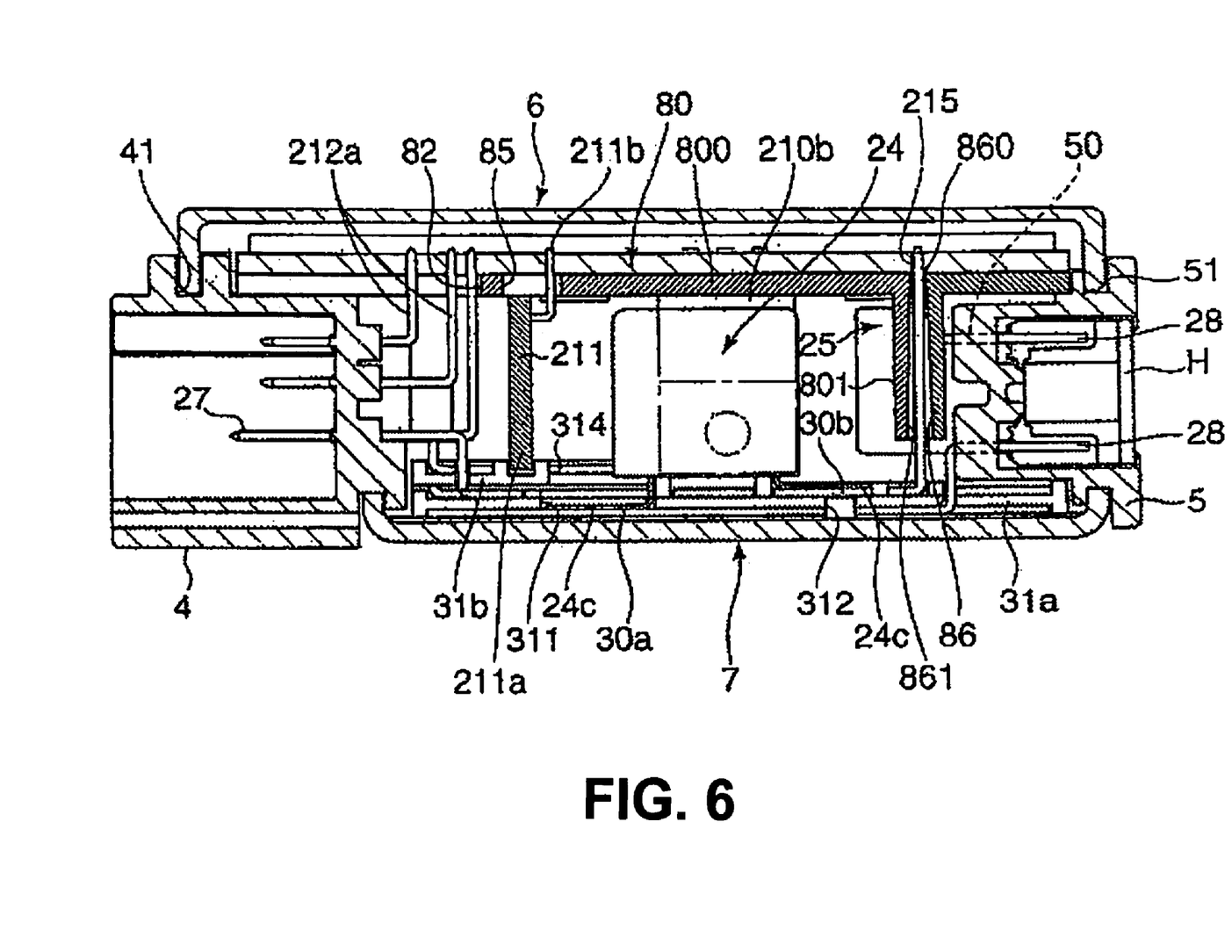
FIG. 6 is a cross sectional view of the distribution unit taken along line VI—VI in FIG. 4.

FIG. 3 is an exploded perspective view of the circuit assembly 2 in the distribution unit 1. FIG. 4 is a longitudinal sectional view of the distribution unit 1 taken along line IV—IV in FIG. 1. FIGS. 5 and 6 are cross sectional views of the distribution unit 1 taken along line V—V and line VI—VI in FIG. 4.

The circuit assembly 2 includes electrical power circuits for distributing an electrical power from a common electrical power source on a vehicle among the respective electrical loads under a predetermined condition. The circuit assembly 2 comprises a bus bar substrate 20 in which a plurality of bus bar layers 30 (30a to 30c) each including a plurality of bus bars 22 juxtaposed on the substantially same plane are stacked through insulation plates 31 (31a, 31b) alternately, a control circuit substrate 21 disposed above the bus bar substrate 20 by a given distance substantially in parallel to the bus bar substrate 20, and a heat-insulating member 80 interposed between the bus bar substrate 20 and the control circuit substrate 21 to insulate them thermally.

The circuit assembly 2 is formed into a flat block configuration having a substantially rectangular shape in plan view. A number of connector terminals 27 having the given bus bars 22 bent in a hook-like shape are juxtaposed and projected forward from a flat rectangular area A (see FIG. 4) at the front side of the circuit assembly 2. A plurality of fuse terminals 28 having the given bus bars 22 bent in a hook-like shape are substantially contained in the flat rectangular area A and projected rearward in two stages at the rear side of the circuit assembly 2.

A plurality of first relays 24 (four in the exemplary embodiment) are mounted along a longitudinal direction (right and left direction) on the upper surface of the bus bar substrate 20 between the connector terminals 27 and the fuse terminals 28. One or more of the fuse terminals 28 are disposed closely to one another in the circuit assembly 2. Second relays 25 are mounted between the compacted fuse terminals 28 on the upper surface of the bus bar substrate 20.

To be more specific, the bus bar substrate 20 includes a plurality of bus bar layers 30a to 30c, insulation plates (insulation layers) 31a and 31b interposed between the adjacent bus bar layers 30a to 30c, and two kinds of relays 24 and 25 as electrical power components mounted on the given bus bars 22 on the bus bar substrate 20. In the exemplary embodiment, as shown in FIG. 3, the first insulation plate 31a is disposed between the first and second bus bar layers 30a and 30b in the bus bar substrate 20 while the second insulation plate 31b is disposed between the second and third bus bar layers 30b and 30c. Although the bus bar substrate 20 having the three stages including the bus bar layers 30a to 30c is used in the exemplary embodiment, the number of the stacking layers is not limited to the three stages, so long as the stacking layers are plural layers.

A plurality of bus bars 22 are arranged in a given pattern on the substantially same plane of each of the bus bar layers 30a to 30c, as described above. The given bus bar 22 is bent vertically and a distal end of the bent bus bar is further bent in a horizontal direction to form the connector terminal 27 or the fuse terminal 28 in a hook-like configuration. A pin-like terminal (upright terminal) 32 is formed by bending the given bus bar 22 in each of the bus bar layers 30a to 30c so that the pin-like terminal 32 projects from the upper surface of the first relay 24 or the second relay 25. The distal end of the pin-like terminal 32 is connected to a control circuit of the control circuit substrate 21. Electrical signals are transmitted through the pin-like terminal 32 from the control circuit substrate 21 to control actuation of the first and second relays 24 and 25 disposed on the given bus bar layers 30a, 30b, or 30c.

The first and second relays 24 and 25 are mechanical type relays and include relay bodies 24a and 25a having substantially rectangular parallelepiped configurations and a plurality of flat plate leg-like terminals 24b and 25b, respectively.

The leg-like terminals 24b of the first relay 24 extend downward from a lower surface of the relay body 24a and are bent along the bus bar layer 30 to be formed into contact pieces 24c to be superposed on the given bus bar 22. Particularly, the leg-like terminal 24b of the first relay 24 in the exemplary embodiment is bent at the end near the side of the relay body 24a to become a whole height of the first relay 24 including the leg-like terminal 24b as low as possible. On the other hand, the second relay 25 has leg-like terminals 25b that extend from a lower surface of a relay body 25a along the bus bar layer 30. Thus, the leg-like terminals 25b define contact pieces 25c to be superposed on the given bus bar 22 in the third bus bar layer 30c. Since the entire leg-like terminals 25b of the second relay 25 serve as contact pieces 25c, a whole height of the second relay 25 becomes as low as possible.

To be more specific, the first relay 24 is mounted on the given bus bars 22 in the lowermost layer or first bus bar layer 30*a* and in an intermediate layer or second bus bar layer 30*b*. Accordingly, the leg-like terminals 24*b* of the first relay 24 include the contact piece 24*c* to be superposed on the bus bar 22 of the first bus bar layer 30*a* and the contact piece 24*c* to be superposed on the bus bar 22 of the second bus bar layer 30*b*. A stepped portion between the respective leg-like terminals 24*b* corresponding to the respective bus bar layers 30*a* and 30*b* is provided in the substantially same manner as a stepped portion between the first and second bus bar layers 30*a* and 30*b*. Thus, if the stepped portion is provided between the leg-like portions 24*b* by the bus bar layers 30*a* and 30*b* to be joined, the leg-like terminals of the first relay 24 are not forcedly deformed regardless of the stepped portion between the layer surfaces and a stress exerted in the respective leg-like terminals can be greatly reduced.

On the other hand, the whole height of the second relay 25 is lower than that of the first relay 24. The second relay 25 is mounted on the bus bar 22 of the uppermost layer or the third bus bar layer 30*c* and has a contact piece 25*c* over the entire length thereof, thereby reducing the whole height of the second relay 25 as low as possible. In the real mounting state, the top of the second relay 25 is lower than that of the first relay 24.

The first and second relays 24 and 25 are connected to the given bus bars 22 at the contact pieces 24*c* and 25*c* by welding. In the exemplary embodiment, the portions to be joined are welded by a resistance welding method in which a pair of electrodes clamp the portions and a high current is supplied to the electrodes to generate resistance heat in matrix materials. The welding method is not limited to the resistance welding method so long as the matrix materials are welded and joined by any welding method such as a laser welding method. Thus, greater strength can be obtained in joining between the first and second relays 24 and 25 by a welding method than a soldering method. Further, heat resistance can be enhanced in the joining portion and to obtain a positive joining. The first and second relays 24 and 25 are mounted on the bus bar substrate 20 after forming the substrate 20. A concrete mounting method will be described after.

On the other hand, the insulation plates 31*a* and 31*b* serve to prevent a short circuit between the bus bars 22 arranged on the bus bar layers 30*a* to 30*c* as well as a short circuit among the bus bar layers 30*a*, 30*b*, and 30*c*. The insulation plates 31*a* and 31*b* are formed into flat plates made of an electrically insulation material.

The first insulation plate 31*a* interposed between the first bus bar layer 30*a* and the second bus bar layer 30*b* disposed above the first bus bar layer 30*a* is provided in the upper and lower surfaces (front and rear sides) with bus bar containing-grooves 310 (see FIG. 3) that receive the respective bus bars 22 on the first and second bus bar layers 30*a* and 30*b* individually. The respective bus bars 22 are contained and positioned in the bus bar containing-grooves 310.

The first insulation plate 31*a* is provided in a given position with first terminal receiving-apertures 311 (see FIG. 5) that pass the plate 31*a* in the thickness direction and receive leg-like terminals 24*b* to be joined to the bus bar 22 on the first bus bar layer 30*a* out of the leg-like terminals 24*b* of the first relay 24. The first terminal receiving-aperture 311 is formed into the substantially same shape as that of the leg-like terminal 24*b* of the first relay 24 and is set to be the substantially same size in a plan view. The first terminal receiving-aperture 311 is set to be a size enough to insert an electrode for resistance welding, so that the resistance welding can be performed by effectively utilizing the first terminal receiving-aperture 311.

In the case of effecting resistance welding in a bus bar layer (the second bus bar layer 30*b* in the first embodiment) above the first insulation plate 31*a*, an electrode receiving-aperture 312 (see FIG. 6) is provided in the first insulation plate 31*a* so that a lower electrode can contact with the given bus bar 22 on the second bus bar layer. A portion of the given bus bar 22 on the second bus bar layer 30*b* (a portion to be joined to the right leg-like terminal 24*b* of the first relay 24 in FIG. 5) is exposed downward through the electrode receiving-aperture 312.

A second insulation plate 31*b* is interposed between the second bus bar layer 30*b* and the third bus bar layer 30*c* above the second bus bar layer 30*b*. The second insulation plate 31*b* is provided in the upper (front) surface with bus bar containing-recesses 313 (see FIG. 3) for containing the respective bus bars 22 on the third bus bar layer 30*c* individually to position the respective bus bars 22. The second insulation plate 31*b* is provided in the given positions with second terminal receiving-apertures 314 (see FIG. 3) that pass the plate 31*b* in a thickness direction and receive the leg-like terminals 24*b* of the first relay 24.

Some of the second terminal receiving-apertures 314 are communicated with the first terminal receiving-apertures 311 in the vertical direction with the respective insulation plates 31*a* and 31*b* being stacked. The joined potions of the given bus bar 22 on the first bus bar layer 30*a* are exposed through the communicated first and second terminal receiving-apertures 311 and 314.

In the exemplary embodiment, the terminal receiving-apertures 311 and 314 are formed in the first and second insulation plates 31*a* and 31*b* to expose the joining portions of the given bus bars 22 on the bus bar layers. In the case where the bus bar 22 on the bus bar layer is disposed above or below the joining portions, a terminal receiving-aperture is also provided in the bus bar additionally.

Electrodes of a certain welding machine are inserted into the first and second terminal receiving-apertures 311 and 314 and the electrode receiving-aperture 312 to clamp the joining portions. Then, a high current is supplied to the electrodes to mount the relay 24 on the bus bar substrate 20 by resistance heat.

Furthermore, a body receiving-aperture 315 (see FIGS. 3 and 5) is provided in the second insulation plate 31*b* to be communicated with the second terminal receiving-aperture 314 to cause a relay body 24*a* of the first relay 24 to pass the aperture 315. The body receiving-aperture 315 is provided around the peripheral edge with a surrounding rib 316 (see FIG. 5).

On the other hand, the control circuit substrate 21 includes a control circuit for controlling actuation of the first and second relays 24 and 25 that are the circuit components, for example, a printed circuit substrate (conductors are arranged on an insulation plate to form a control circuit). The control circuit substrate 21 is a plate-like configuration slightly larger than the bus bar substrate 20 and includes a plurality of semiconductors 210 mounted on the front and rear sides (upper and lower surfaces in FIG. 5), an auxiliary substrate 211 (see FIG. 5) disposed on the rear side, and a connector pin-like terminal 212 connected to the control circuit.

To be more specific, the semiconductor 210 includes an LSI (large scale integrated circuit) 210*a* that is disposed on a substantially central part on the front surface of the control circuit substrate 21 and serves as a microprocessor and FETs (field-effect transistors) 210*b*, each of them being disposed on the laterally opposite ends on the rear surface. The circuit components (the LSI 210*a* and FETs 210*b*), which generate a relatively great heating value due to their actuations, are arranged on a peripheral edge portion of the circuit assembly 2. Thus, because the circuit components that generate a relatively great heating value are disposed on a peripheral edge portion of the circuit assembly 2, this makes it easy to radiate heat and can enhance an efficiency of heat radiation in the circuit components. Further, a potting agent filled in the front side of the control circuit substrate 21 seals the LSI 210a while each FET 210b is adhered to the lower casing 7 in a manner of transmitting heat, thereby further enhancing efficiencies of heat radiation of them.

The auxiliary substrate 211 includes a printed circuit substrate in the same manner as the control circuit substrate 21 and forms some of control circuits for controlling the various kinds of circuit components. The auxiliary substrate 211 is formed into a plate-like configuration and interposed between the bus bar substrate 20 and the control circuit substrate 21. The auxiliary substrate 211 includes a substrate body 211a and a substrate terminal 211b provided on a suitable position on the substrate body 211b and is arranged along the longitudinal direction of the control circuit substrate 21.

Some of the control circuits to be formed on the control circuit substrate 21 are formed on the auxiliary substrate 211. By disposing the auxiliary substrate 211 between the bus bar substrate 20 and the control circuit substrate 21 in perpendicular to the respective substrates 20 and 21, the circuit assembly 2 can be made compact while effectively utilizing a space between the respective substrates 20 and 21 on which the first and second relays 24 and 25 are disposed. It is possible to optionally omit the auxiliary substrate 211. In this case, all of the control circuits are formed on the control circuit substrate 21.

The control circuit substrate 21 is provided in the given positions with through-holes 215. A pin-like terminal 32 standing from the bus bar 22 and a connector pin-like terminal 212 are forcedly inserted into the through-holes 215 and their ends are electrically joined to the control circuit by soldering.

Next, a heat-insulating member 80 will be described below. The heat-insulating member 80 is made of a material having a certain heat-insulating property, such as a synthetic resin material including, for example, polypropylene terephthalate (PPT), polybutylene terephthalate (PBT), nylon alloy, or the like. The heat-insulating member 80 is attached to the control circuit substrate 21 and includes a body section 800 interposed between the first and second relays 24 and 25 and the control circuit substrate 21 and positioning and reinforcing sections 801 that project from a lower surface of the body section 800 downward (to the sides of the bus bar layers 30a to 30c).

The body section 800 is formed into a rectangular plate-like configuration having the substantially same size as that of the control circuit substrate 21. On the other hand, each of the positioning and reinforcing sections 801 surrounds an intermediate portion of the pin-like terminal 32 by a given length to prevent the pin-like terminal 32 from being deformed due to buckling while positioning the end of the pin-like terminal 32 standing on the bus bar substrate 20.

That is, because the pin-like terminal 32 is formed by bending the given bus bar 22 on the bus bar substrate 20, for example, when the bent end of the pin-like terminal 32 may be shifted from the regular position due to its slight elastic recovery, there may happen to cause a problem that the control circuit substrate 21 cannot be correctly installed in the circuit assembly 2. On the contrary, the positioning and reinforcing sections 801 can correct the position of the pin-like terminals 32, particularly the ends of the pin-like terminals 32 in the exemplary embodiment, thereby facilitating attachment of the control circuit substrate 21.

In the case where the control circuit 21 is installed in the circuit assembly when the pin-like terminal 32 is slightly shifted from the correct position, the pin-like terminal 32 does not pass the through-hole 215 in the control circuit substrate 21 regularly. Consequently, the end of the pin-like terminal 32 is buckled and deformed by the control circuit substrate 21, so that the respective circuits on the bus bar substrate 20 and control circuit substrate 21 are not electrically connected to one another.

However, according to the exemplary embodiment, because the positioning and reinforcing sections 801 are provided to surround the intermediate portions of the pin-like terminals 32, the pin-like terminals 32 can be effectively restrained from deforming due to buckling. Accordingly, the pin-like terminals 32 can be inserted into the through-holes 215 in the control circuit substrate 21 while shifting the ends of the pin-like terminals 32 to the correct positions. Thus, electrical connection can be correctly and positively obtained between the respective circuits of the bus bar substrate 20 and control circuit substrate 21.

To be more specific, the positioning and reinforcing sections 801 are provided in the positions corresponding to the pin-like terminals 32 and are formed into rectangular parallelepiped configurations. A length of each of the positioning and reinforcing sections 801 can be set optionally within a length of the pin-like terminal 32. In the exemplary embodiment, the length of the section 801 extends over a lower half portion of the pin-like terminal 32. A pin-like terminal receiving-aperture 86 is provided longitudinally in each of the positioning and reinforcing sections 801 of the heat-insulating member 80. When the pin-like terminal 32 is inserted into the receiving-aperture 86, each of the positioning and reinforcing sections 801 can surround the intermediate portion of the pin-like terminal 32 over the given length.

The pin-like terminal receiving-aperture 86 is tapered from the side of the bus bar layers 30a to 30c to the side of the control circuit substrate 21, as shown in FIG. 6. That is, a lower opening 861 of the pin-like terminal receiving-aperture 86 is larger than an upper opening 860 of the receiving-aperture 86. In the exemplary embodiment, the upper opening 860 is formed in association with longitudinal sectional shape and area of the pin-like terminal 32 while a diameter of the lower opening 861 is about 2.5 times larger than that of the upper opening 860. The tapered pin-like terminal receiving-aperture 86 can receive the pin-like terminal 32 through the larger lower opening 861, even if the pin-like terminal 32 inclines slightly. In addition, the smaller upper opening 860 can position the pin-like terminal 32 correctively.

The body section 800 of the heat-insulating member 80, as shown in FIG. 3, is provided with a plurality of cutouts 82, 83 and a slot 85 so that the body section 800 does not interfere with the circuit components 210 and auxiliary substrate 211 to be connected to the control circuit substrate 21.

To be more specific, the body section 800 is provided in the front end edge with the cutouts 82 (see FIG. 3) in which vertical portions 212a of connector pin-like terminals 212 are disposed. An end of each connector pin-like terminal 212 is connected through the cutout 82 to the control circuit substrate 21.

A pin-like terminal receiving-aperture for receiving a single or plural connector pin-like terminals 212 may be provided in place of the cutout 82. In the case where a pin-like terminal receiving-aperture for receiving a single connector pin-like terminal 212 is provided, it is possible to position the connector pin-like terminal 212, thereby facilitating attachment of the control circuit substrate 21.

The body section 800 is provided at the rear end side with an elongated substrate receiving-slot 85 (see FIG. 3) extending in a longitudinal direction (right and left direction). The auxiliary substrate 211 to be connected to the control circuit substrate 21 can pass the substrate receiving-slot 85. The substrate receiving-slot 85 is formed into a size enough to pass a substrate body 211a of the auxiliary substrate 211 and a substrate terminal 211b of the substrate 211 at the same time.

Furthermore, the body section 800 is provided at the opposite longitudinal sides of the substrate receiving-slot 85 with component cutouts 83 (see FIG. 3) for passing the FET 210b and the like to be mounted on the control circuit substrate 21. In order to pass a capacitor 210c (see FIG. 4) to be mounted on the control circuit substrate 21 as well as the FET 210b, the component cutouts 83 is made larger. That is, the component cutouts 83 are provided for circuit components to be mounted on the lower surface of the control circuit substrate 21.

On the other hand, the connector mounting-section 4 is made of a resin material and has the same height and lateral length as those of the circuit assembly 2. The connector mounting-section 4 is provided with connector terminal receiving-apertures 40 (see FIG. 2) for receiving the connector terminal 27 and a connector pin-like terminal 212. The respective ends of the connector terminal 27 and connector pin-like terminal 212 project through the connector terminal receiving-apertures 40 into the connector mounting-section 4 so that the ends can be connected to external connectors. The connector mounting-section 4 is provided in the peripheral portion with a casing fitting-groove 41. When the respective font end edges of the upper and lower casings 6 and 7 are fitted into the casing fitting-groove 41, the connector mounting-section 4 is incorporated with the casings 6 and 7.

On the other hand, the fuse mounting-section 5 is made of a resin material and has the same height and lateral length as those of the circuit assembly 2. The fuse mounting-section 5 is provided with fuse terminal receiving-apertures 50 (see FIG. 6) for receiving the fuse terminals 28. Ends of the fuse terminals 28 project through the fuse terminal receiving-apertures 50 into the fuse mounting-section 5 so that the ends of the terminals 28 can be connected to external connectors.

The fuse mounting-section 5 is provided in the peripheral portion with a casing fitting-groove 51. When the respective rear end edges of the upper and lower casings 6 and 7 are fitted into the casing fitting-groove 51, the fuse mounting-section 5 is incorporated with the casings 6 and 7 so that a main part of the fuse mounting-section 5 is contained in the casings 6 and 7.

The upper casing 6 is formed into a dish-like configuration that has a substantially rectangular shape in plan view and is open downward. The upper casing 6 is made of a material having a good heat conduction property, such as an aluminum base metal. A potting agent such as silicone resin is filled in the upper casing 6 previously, so that the various kinds of circuit components including the LSI 210a mounted on the front side (upper surface) of the control circuit substrate 21 are sealed. The upper casing 6 is provided on the right and left side surfaces with a pair of front and rear engaging bulge portions 60. The lower casing 7 is provided in the right and left sidewalls with engaging holes 70. When the bulge portions 60 are fitted into the engaging holes 70, the upper and lower casings 6 and 7 are interlocked with the casings 6 and 7 containing the circuit assembly 2.

The lower casing 7 is formed into a box-like configuration that is open upward. The lower casing 7 is made of a material having a good heat conduction property, such as an aluminum base metal in the same manner of the upper casing 6. The lower casing 7 is cut out at a substantially whole of the front and rear sidewalls to form a cutout portion 71. The connector mounting-section 4 and fuse mounting-section 5 are attached to the cutout portion 71. The circuit assembly 2 is adhered to an upper surface of a bottom wall 72 of the lower casing 7 with an adhesive having a good electrical insulation property, such as epoxy resin. The interior of the lower casing 7 is filled with a potting agent. The potting agent seals the leg-like terminals 24b and 25b of the first and second relays 24 and 25. The lower casing 7 is provided in the right and left sidewalls with two pairs of front and rear engaging holes 70 into which the engaging bulge portions 60 are fitted.

Next, a method for producing the bus bar substrate 20, circuit assembly 2 and distribution unit 1 installing the circuit assembly 2 will be explained below.

First, the bus bar substrate 20 is produced before the heat-insulating member 80 is installed on the bus bar substrate 20. In the exemplary embodiment, the second relay 25 is mounted on the given bus bar 22 upon a step of stacking the bus bar layers 30a to 30c and the insulation plates 31a and 31b while the first relay 24 is mounted on the given bus bar 22 after having done the above stacking step.

The respective relays 24 and 25 may be mounted on the given bus bars after or during the above stacking step. In the case where at least one of the first and second relays 24 and 25 is mounted after the stacking step, it is necessary to provide terminal receiving-apertures in the insulation plate in connection with the relay to be mounted after forming the bus bar substrate 20 by the same manner described above and also provide electrode receiving-apertures for resistance welding, if desired.

The exemplary embodiment utilizes a bus bar assembly (not shown) to superpose the respective bus bar layers 30a to 30c and insulation plates 31a and 31b. The bus bar assembly is formed by punching out, for example, a metallic plate so that the respective bus bars 22 are arranged in a given arrangement pattern on the same plane, with the bus bars 22 being joined to an outer frame (not shown). The connecting portions between the bus bars 22 and the outer frame are cut off after superposing the bus bar layers 30a to 30c on the insulation plates 31a and 31b so that the given bus bars are disposed in the given arrangement pattern. This bus bar assembly will facilitate handling of the bus bars 22.

Figure 7:
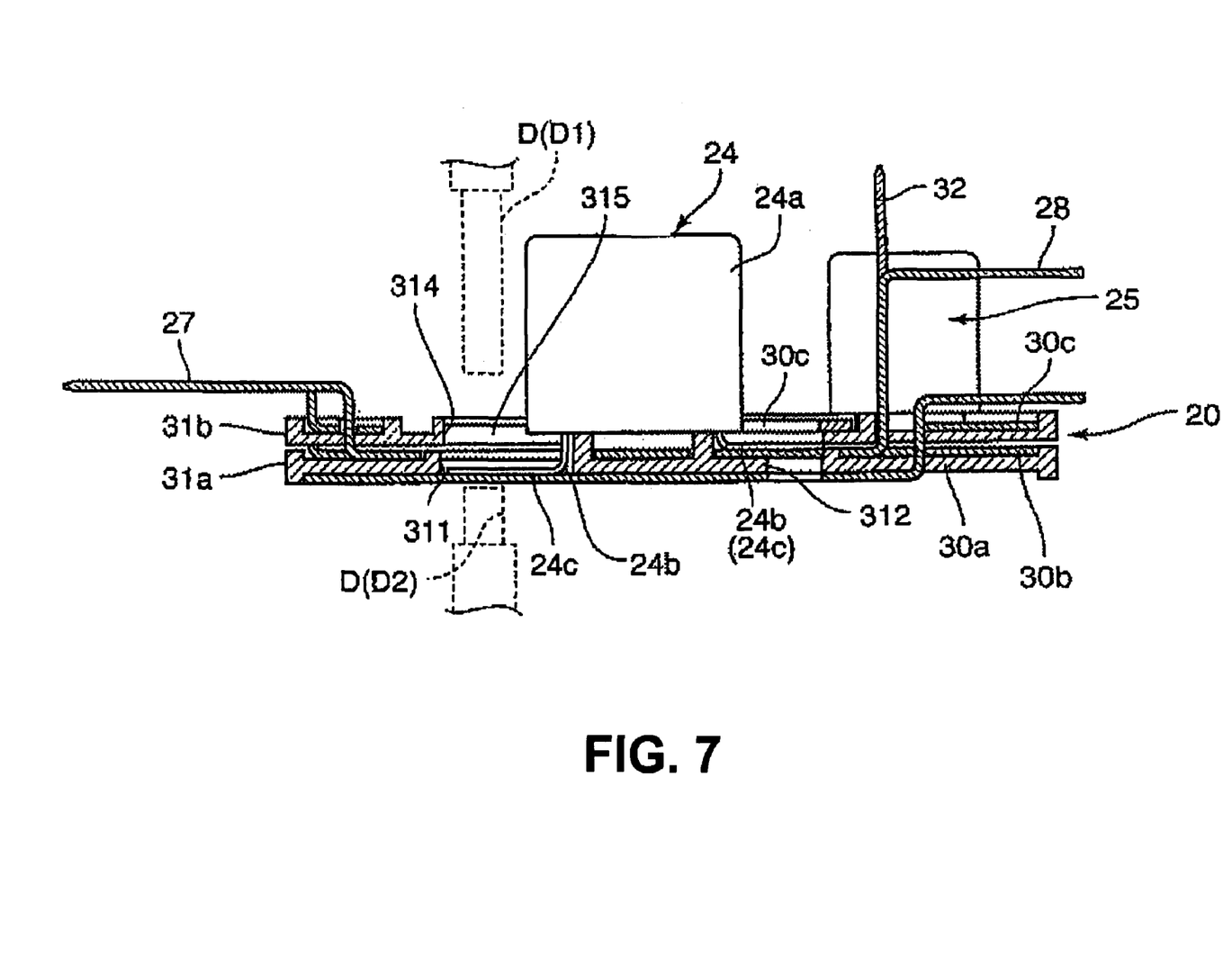
FIG. 7 is a sectional view of a bus bar substrate of the circuit assembly in accordance with the exemplary invention, illustrating the bus bar substrate in a position before installing a heat-insulating member on the substrate.

To be more specific, firstly the bus bar substrate 20 on which the first and second relays 24 and 25 are mounted, as shown in FIG. 7, is produced. Upon mounting the respective relays 24 and 25 on the substrate 20, the contact pieces 24c and 25c of the leg-like terminals 24b and 25b of the respective relays 24 and 25 are stacked on the given bus bars 22. An upper electrode D1 and a lower electrode D2 for resistance welding clamp the stacked portions and the relays 24, 25 and the bus bars 22 are joined by resistance welding.

Figure 8:
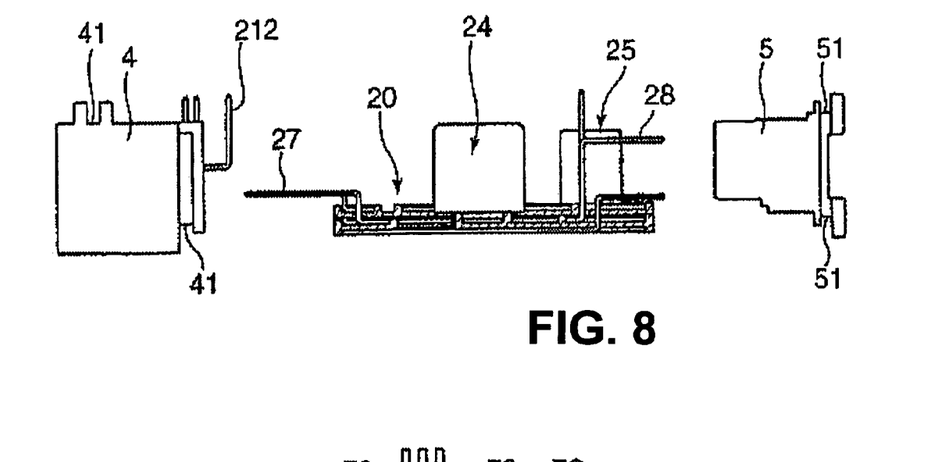
FIG. 8 is an explanatory view of a step for attaching the respective mounting-sections to the bus bar substrate.

As shown in FIG. 8, the connector mounting-section 4 and fuse mounting-section 5 are attached to the bus bar substrate 20 (mounting-section attaching step). To be more specific, the connector pin-like terminals 212 have been previously inserted into some of the connector terminal receiving-apertures 40 in the connector mounting-section 4 while the connector terminals 27 on the bus bar substrate 20 are inserted into the other connector terminal receiving-apertures 40. Then, the connector mounting-section 4 is attached to a front end of the bus bar substrate 20. The fuse terminals 28 of the bus bar substrate 20 are inserted into the fuse terminal receiving-apertures 50 in the fuse mounting-section 5. Then, the fuse mounting-section 5 is attached to a rear end of the bus bar substrate 20.

Figure 9A:
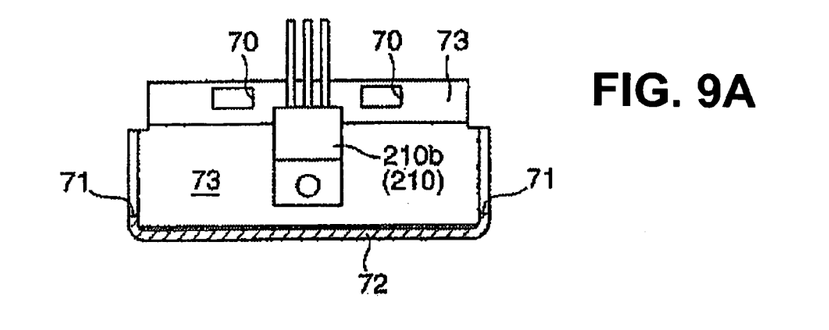
FIGS. 9A and 9B are cross and longitudinal sectional views of a lower casing.
Figure 9B:
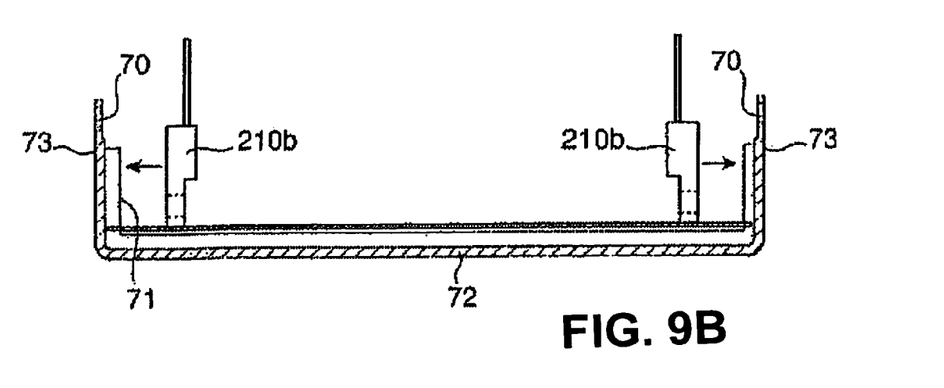

Subsequently, the lower casing 7 shown in FIG. 9 is attached to the bus bar substrate 20 after the attaching step of the respective mounting-sections 4 and 5. The exemplary embodiment utilizes the lower casing 7 wherein each FET 210*b* on the control circuit substrate 21 is adhered at the given position to an inner surface of each of the right and left sidewalls 73 of the lower casing 7.

The lower casing 7 is attached to the bus bar substrate 20 by engaging the edge of the cutout portion 71 of the lower casing 7 with the respective casing fitting grooves 41 and 51 in the connector mounting-section 4 and fuse mounting-section 5 attached to the bus bar substrate 20, and by joining the rear side (lower surface) of the bus bar substrate 20 to an upper surface of a bottom wall 72 of the lower casing 7 by an adhesive. The adhesive having an electrical insulation property is used in the case where the lower casing 7 is made of an electrically conductive material. The adhesive including, for example, an epoxy base resin, a silicone base resin, or the like can be used. The lower casing 7 may be joined to the bus bar substrate 20 through, for example, an insulation layer such as an insulation plate attached to the rear side of the bus bar substrate 20 as well as the adhesive.

A potting agent is filled within the lower casing 7 by a given height to seal the leg-like terminals 24*b* and 25*b* of the first and second relays 24 and 25. The potting agent to be filled is preferably selected from a material having heat conductivity. The silicone base resin that has superior electrical insulation as well as heat conductivity can be used.

Figure 10A:
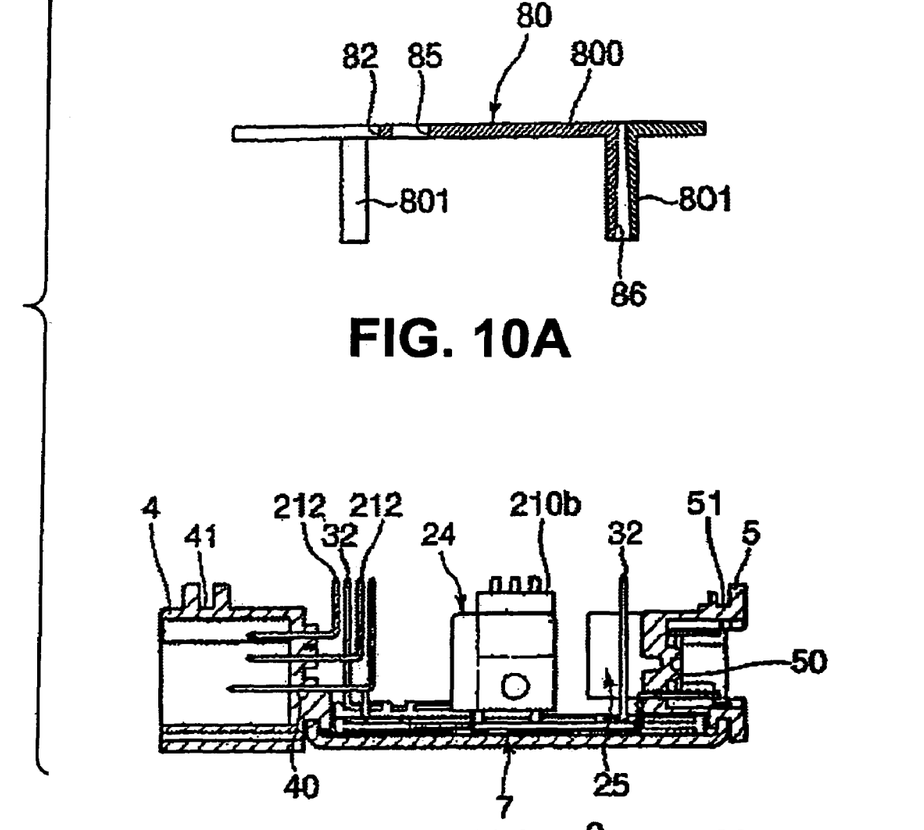
FIGS. 10A and 10B are explanatory views of steps for installing the heat-insulating member on the bus bar substrate in the circuit assembly in accordance with the exemplary invention.
Figure 10B:
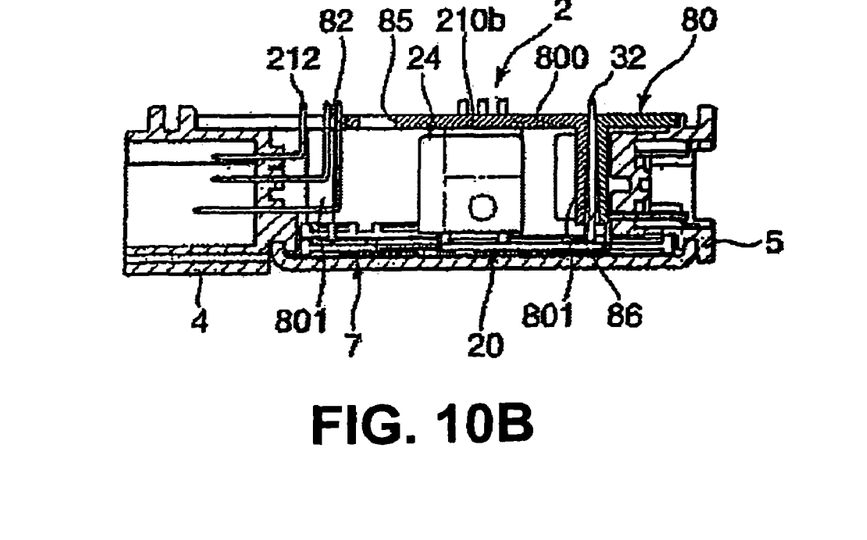

Next, as shown in FIGS. 10A and 10B, a heat-insulating member 80 is mounted on the bus bar substrate 20 (heat-insulating member mounting step). To be more specific, the positioning and reinforcing sections 801 of the heat-insulating member 80 is opposed to the pin-like terminals 32 of the bus bar substrate 20 and the pin-like terminals 32 are inserted into the pin-like terminal receiving-apertures 86 in the positioning and reinforcing sections 801 so that the heat-insulating member 80 is installed on the bus bar substrate 20.

At this time, even if the pin-like terminals 32 are slightly shifted from the regular positions, that is, even if each pin-like terminal 32 is not correctly opposed to each through-hole 215 in the control circuit substrate 21, it is possible to correct the position of the pin-like terminal 32 along the inner surface of the pin-like terminal receiving-aperture 86 when the terminal 32 is being inserted into the aperture 86, thereby facilitating attachment of the control circuit substrate 21 described after.

When the heat-insulating member 80 is mounted on the bus bar substrate 20, the ends of the pin-like terminals 32 are opposed to the through-holes 215 in the control circuit substrate 21 and are projected slightly from the upper surface of the heat-insulating member 80, and the intermediate portions of the pin-like terminals 32 are surrounded by the positioning and reinforcing sections 801. The FET 210*b* that has been previously adhered to the lower casing 7 is disposed in the component cutout 83 in the heat-insulating member 80 in the bus bar substrate 20 while the connector pin-like terminals 212 that have been previously mounted on the connector mounting-section 4 are disposed in the terminal cutout 82 in the heat-insulation member 80.

Figure 11:
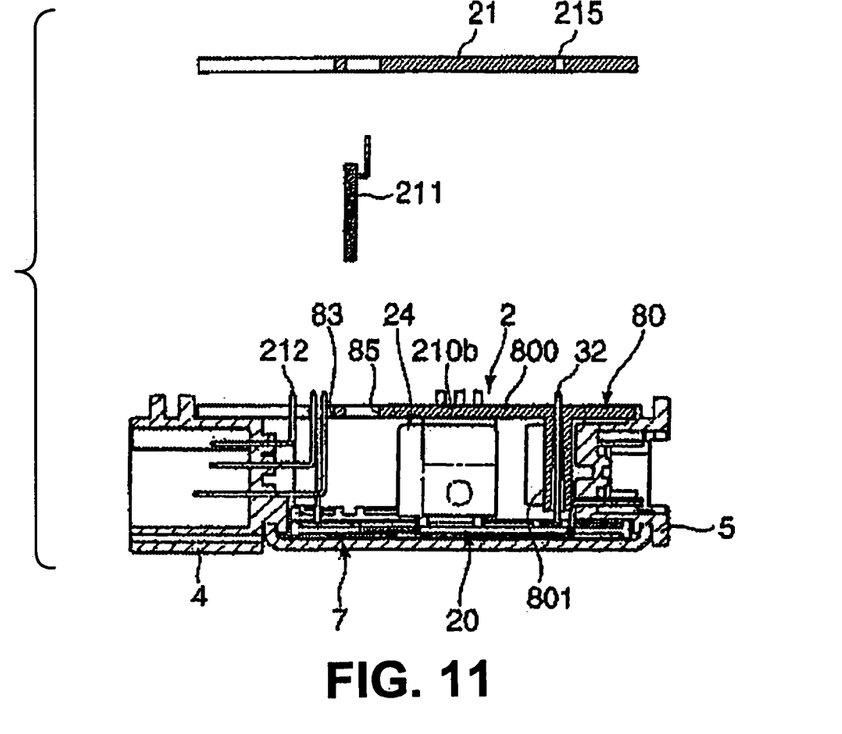
FIG. 11 is an explanatory view of a step for installing a control circuit substrate on the bus bar substrate.

Subsequently, as shown in FIG. 11, the control circuit substrate 21 is installed on the bus bar substrate 20 to form the circuit assembly 2. That is, the control circuit substrate 21, on which various kinds of circuit components including the LSI 210*a* are mounted, is installed above the bus bar substrate 20 to establish a suitable electrical connection. To be more specific, the connector pin-like terminals 212 and pin-like terminals 32 are suitably connected to the electrical circuits including a control circuit on the control circuit substrate 21. The control circuit substrate 21 is installed on the bus bar substrate 20 with the front and rear end edges of the control circuit substrate 21 being supported on upper surfaces of the connector mounting-section 4 and fuse mounting-section 5.

Then, because the positioning and reinforcing sections 801 correctly positions the pin-like terminal 32, it is possible to smoothly install the control circuit substrate 21 on the heat-insulating member 80. In the case where the pin-like terminal 32 is slightly shifted from the through-hole due to errors in dimension, the end of the pin-like terminal 32 contacts with the control circuit substrate 21. However, because each of the positioning and reinforcing sections 801 surrounds the intermediate portion of each pin-like terminal 32, the pin-like terminal 32 is prevented from being deformed by buckling.

Consequently, the end of the pin-like terminal 32 is slightly, elastically deformed and guided into the through-hole 215. Accordingly, even if a plurality of pin-like terminals 32 stand on the bus bar substrate 20, it is possible to insert the respective pin-like terminals 32 into the through-holes 215 in the control circuit substrate 21 positively and correctively, thereby surely obtaining electrical connection between the bus bar substrate 20 and the control circuit substrate 21.

In the installing step of the control circuit substrate 21, the auxiliary substrate 211 is mounted on the rear surface of the control circuit substrate 21 to make electrical connection to each other. That is, upon installation of the control circuit substrate 21, the auxiliary substrate 211 is installed on the control circuit substrate 21. The auxiliary substrate 211 installed on the control circuit substrate 21 passes the substrate-receiving slot 85 in the heat-insulating member 80 so that the auxiliary substrate 211 extends toward the bus bar substrate 20. In the circuit assembly 2 constructed above, the control circuit substrate 21 is spaced away from the bus bar substrate 20 by a given distance and the first and second relays 24 and 25 are disposed in the space between both the substrates 20 and 21.

Figure 12:
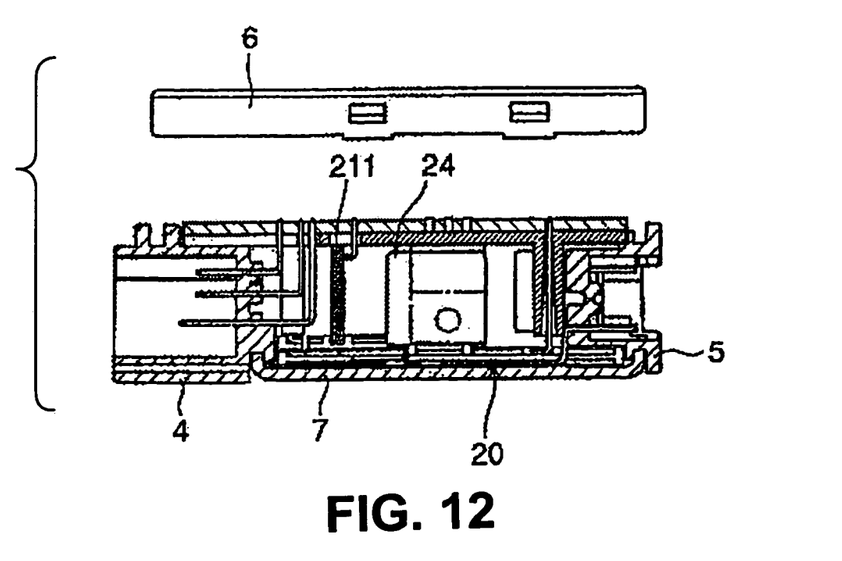
FIG. 12 is an explanatory view of a step for installing an upper casing on the lower casing in the distribution unit.

Finally, as shown in FIG. 12, the upper casing 6 is mounted on the lower casing 7 to produce the distribution unit 1. To be more specific, a potting agent is previously filled within the upper casing 6 and hardened to have a certain shape retention and flexibility property. Then, the upper casing 6 is installed on the lower casing 7. The potting agent is selected from a material having superior heat conductivity. For example, a silicone base resin is preferable, because it has excellent electrical insulation as well as heat conductivity.

Upon assembling the upper and lower casings 6 and 7, the front and rear end edges of the upper casing 6 are engaged with the casing fitting-grooves 41 and 51 in the connector mounting-section 4 and fuse mounting-section 5, the upper casing 6 is fitted into the right and left sidewalls 73 of the lower casing 7, and the engaging bulge portion 60 of the upper casing 6 is fitted into the engaging hole 70 in the lower casing 7.

A fuse H is mounted on the fuse mounting-section 5 to form the distribution unit 1 shown in FIG. 6.

According to the circuit assembly 2 constructed above and the distribution unit 1 installing the circuit assembly 2, because the control circuit substrate 21 is spaced away from the bus bar substrate 20 in parallel by the given distance and the first and second relays 24 and 25 as the circuit components are disposed in the space between both the substrates 20 and 21 to form a double-deck structure, it is possible to dispose the circuit components in compact arrangement. In addition, concerns may be raised in the double-deck structure that the first and second relays 24 and 25 generate heat in association with actuation and such generated heat will affect the control circuit substrate 21, particularly the LSI 210a and the like mounted on the substrate 21.

However, because the heat-insulating member 80 is interposed between the first and second relays 24 and 25 and the control circuit substrate 21 in the circuit assembly 2, the heat generated from the relays 24 and 25 is restrained from affecting the control circuit substrate 21 as much as possible. Consequently, the control circuit substrate 21 and the bus bar substrate can be brought into close arrangement.

Although there is a problem in installation of the bus bar substrate 20 and control circuit substrate 21 in the double-deck structure, the bus bar substrate 20 in the exemplary embodiment can install the control circuit substrate 21 readily and rapidly, as described above, thereby obtaining the circuit assembly excellent in electrical connection.

Although the circuit assembly and the like are described in the above embodiment, it should be noted that the circuit assembly and the like in accordance with the exemplary invention are not limited to the above embodiment. Various modifications can be effected without deviating the spirit of exemplary embodiments of the invention. For example, the following alterations can be adopted.

(1) Although the body section 800 of the heat-insulating member 80 has the substantially same size as that of the control circuit substrate 21 in the above embodiment, the size of the body section 800 of the heat-insulating member 80 is not limited to the above size so long as the body section 800 can be interposed between the first and second relays 24 and 25 and the control circuit substrate 21 and disposed in connection with the respective pin-like terminals 32.

(2) Although the positioning and reinforcing sections 801 extend over the lower half portions of the pin-like terminals 32 in the above embodiment, the length of the positioning and reinforcing sections 801 is not limited to the above length. For example, the length may extend substantially to a central position of the pin-like terminal 32. However, in view of prevention of buckling deformation of the pin-like terminal 32, it is preferable to extend the positioning and reinforcing sections 801 over the central position of the pin-like terminal 32, most preferably to the lower end position of the pin-like terminal 32.

(3) Although the first and second relays 24 and 25 are used as the circuit components to be mounted on the bus bar substrate 20 in the above embodiment, the circuit components to be arranged on a surface of the bus bar substrate 20 are not limited to the above relays. The other circuit components that generate heat in association with actuation may be used.

(4) Although the heat-insulating member 80 having the flat body section 800 is used as a heat-insulating material and is supported at the front and rear edges on the respective mounting-sections in the above embodiment, the heat-insulating member is not limited to a particular configuration. For example, the heat-insulating member may be interposed between the first and second relays 24 and 25 and the control circuit substrate 21 at the top wall thereof and have a box-like configuration that is open at a lower end.

While the invention has been particularly described, in conjunction with specific preferred embodiments, it is evident that many alternatives, modifications, and variations will be apparent to those skilled in the art of the foregoing description. It is therefore contemplated that the appended claims will embrace any such alternatives, modifications, and variations as falling within the true scope and spirit of the invention.

What is claimed is:

1. A circuit assembly, comprising:
a bus bar substrate including:
    a plurality of bus bars constituting an electrical power circuit;
    circuit components connected to the electrical power circuit; and
    a plurality of upright terminals extending from at least one of the plurality of bus bars,
a control circuit substrate being disposed substantially in parallel to the bus bar substrate and including:
    a control circuit for controlling the circuit components; and
    through-holes into which the plurality of upright terminals are inserted and connected electrically, and
a heat-insulating member interposed between the bus bar substrate and the control circuit substrate for performing a heat-insulating function between the substrates, the heat-insulating member including:
    a body section disposed between the bus bar substrate and the control circuit substrate; and
    positioning and reinforcing sections for positioning the upright terminals at the positions corresponding to the through-holes and preventing the upright terminals from being deformed between the substrates, respectively.

2. The circuit assembly according to claim 1, wherein a receiving aperture is provided in each of the positioning and reinforcing sections and each of the receiving apertures surrounds each of the upright terminals inserted into the receiving apertures over the given length of the upright terminals.

3. The circuit assembly according to claim 2, wherein each of the receiving apertures provided in the positioning and reinforcing sections is tapered from the side of the bus bar substrate to the side of the control circuit substrate.

4. The circuit assembly according to claim 2, wherein each of the receiving apertures in the positioning and reinforcing sections extend to the lower half portion of each of the upright terminals.

5. The circuit assembly according to claim 3, wherein each of the receiving apertures in the positioning and reinforcing sections extend to the lower half portion of each of the upright terminals.

* * * * *